United States Patent

Satsu et al.

[11] Patent Number: 5,712,080
[45] Date of Patent: Jan. 27, 1998

[54] METHOD FOR MANUFACTURING PRINTED CIRCUIT BOARD

[75] Inventors: Yuichi Satsu; Haruo Akahoshi; Mineo Kawamoto, all of Hitachi; Akio Takahashi, Hitachioota; Masashi Miyazaki, Hadano; Toshiaki Ishimaru, Hitachi, all of Japan

[73] Assignees: Hitachi, Ltd.; Hitachi Chemical Company, Ltd., both of Tokyo, Japan

[21] Appl. No.: 801,421

[22] Filed: Feb. 18, 1997

Related U.S. Application Data

[63] Continuation of Ser. No. 394,762, Feb. 27, 1995, abandoned.

[30] Foreign Application Priority Data

Feb. 25, 1994 [JP] Japan .................................. 6-027796

[51] Int. Cl.$^6$ .............................. H05K 3/10; G03F 7/085
[52] U.S. Cl. .................. 430/315; 430/954; 430/277.1; 430/275.1
[58] Field of Search .............................. 430/315, 954

[56] References Cited

U.S. PATENT DOCUMENTS

| | | | |
|---|---|---|---|
| 3,622,334 | 11/1971 | Matawan et al. | |
| 4,539,286 | 9/1985 | Lipson et al. | 430/910 X |
| 4,980,266 | 12/1990 | Kawaguchi et al. | 430/281 |
| 5,028,513 | 7/1991 | Murakami et al. | 430/313 |
| 5,438,751 | 8/1995 | Miyazaki et al. | 430/315 X |

FOREIGN PATENT DOCUMENTS

| | | |
|---|---|---|
| 0 337 465 | 10/1989 | European Pat. Off. |
| 0 398 713 | 11/1990 | European Pat. Off. |
| 2 074 487 | 10/1971 | France. |
| 2 337 890 | 8/1977 | France. |
| 53/702 | 1/1978 | Japan. |

OTHER PUBLICATIONS

Kirk–Othmer Encyclopedia of Chemical Technology, third edition, vol. 8, John Wiley & Sons, New York, N.Y., 1979, pp. 738–750.

*Primary Examiner*—Cynthia Hamilton
*Attorney, Agent, or Firm*—Antonelli, Terry, Stout & Kraus, LLP

[57] ABSTRACT

A method for manufacturing printed circuit board by forming wiring pattern by chemical metal plating using a negative pattern made of a photosensitive resin composition layer as the plating resist, wherein the photosensitive resin comprises at least a linear high polymer composed of repeating units expressed by the following general formula (1);

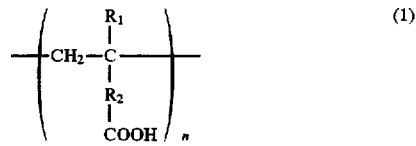

where, $R_1$ is H, an alkyl group having 1-9 carbon atoms, an alkoxy group having 1-9 carbon atoms, and a carboxyalkyl group having 1-9 carbon atoms, $R_2$ is an alkylene group having 1-9 carbon atoms, and n is the polymerized number of the repeating unit, and an organic compound expressed by the following general formula (2);

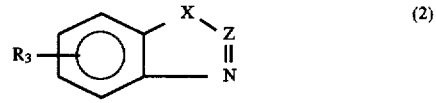

where, $R_3$ is H or an alkyl group having 1-6 carbon atoms, X is NH or S, and Z is N or C—Y, where Y is H, $NH_2$, or SH.

7 Claims, 6 Drawing Sheets

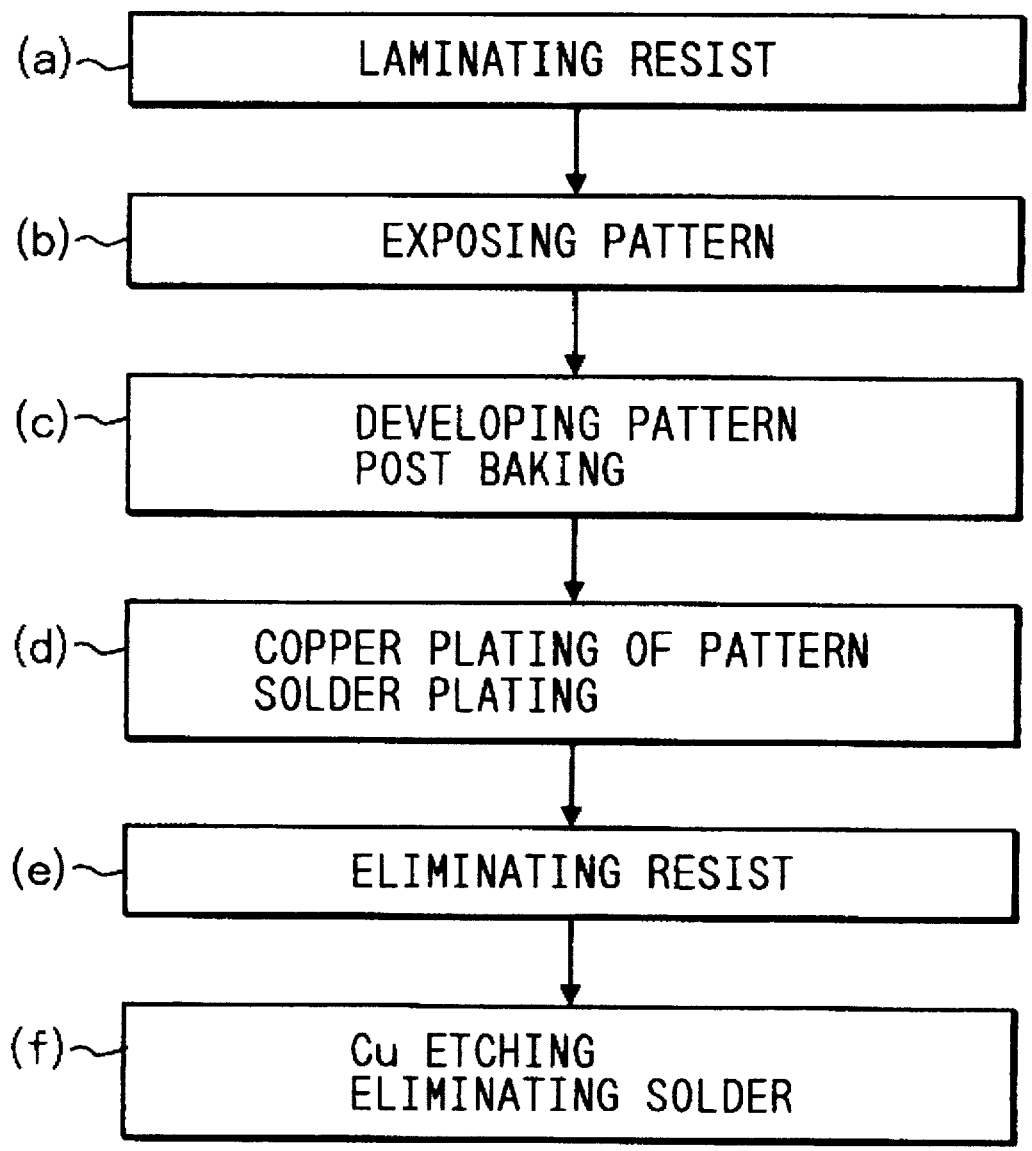

METHOD FOR MANUFACTURING PRINTED CIRCUIT BOARD

This application is a Continuation application of application Ser. No. 394,762, filed Feb. 27, 1995, now abandoned.

BACKGROUND OF THE INVENTION (1) Field of the Invention

The present invention relates to a method for manufacturing printed circuit board using semi-additive chemical copper plating, printed circuit boards manufactured by the same, and computer using the printed circuit boards manufactured by the same.

(2) Description of the Prior Art:

In accordance with current advancement in miniaturization and fast operation of electronic devices, printed circuit boards for computers also increase their wiring density. For example, copper wiring has come to have an aspect ratio of approximately 1 (one), and formation of the wiring by subtract method has become difficult. Therefore, additive methods have come to be as main methods for forming the wiring.

Methods using plating are superior in forming copper wiring having a high aspect ratio, especially, chemical plating methods which can form film of uniform thickness are superior in forming a copper wiring board having an area wider than 1 $dm^2$. Further, in accordance with increasing wiring density at present, film thickness more than 70 μm is required in some cases. In these cases, necessary time for the plating frequently exceeds 30 hours. Because of using alkaline solution of pH more than 12 as plating solution in the chemical copper plating, deterioration of resist and penetration of plating solution into intervals at boundaries between the resist and base metal will occur by immersion of the resist in the plating solution for such a long time, and problems will be generated in adhesiveness at the boundaries.

In a conventional method for manufacturing printed circuit board comprising the steps of forming a photosensitive resin composition layer at surface of a substrate of copper clad laminate, forming a negative pattern of said photosensitive resin composition layer by exposure and development, and forming wiring pattern by chemical copper plating using said negative pattern of said photosensitive resin composition layer as a plating resist, an example of composition constituted of (a) thermoplastic organic high polymer compound, (b) non-water soluble monomer having a photopolymerizable unsaturated bond, (c) non-water soluble photo-polymerization initiator, and (d) compounds for improving performance of resist has been disclosed as explained hereinafter.

A method was disclosed in JP-B-50-9177 (1975) wherein, as for the above compounds for improving performance of resist, for instance, any one of benzimidazole, benzotriazole, benzothiazole, or their derivatives was added to the plating resist as an adhesion promoter for improving adhesive performance at boundaries between base metal and the plating resist. However, the method disclosed in JP-B-50-9177 (1975) had a problem that plating solution was contaminated by the above adhesion promoter which dissolved into the plating solution during operation, and consequently generated plating film was deteriorated.

As compounds for solving the above problem and giving superior anti-plating solution, anti-etching solution, and anti-chemicals properties, derivatives of benzotriazole wherein H combined to N of benzotriazole was substituted with one of linear amino hydrocarbon derivative groups such as bis (N,N-2-ethylhexylaminomethylene)-1,2,3-benzotriazole were disclosed in JP-A-61-223836 (1986). However, the derivatives of benzotriazole have problems such as causing peeling off or separation of resist film from base metal depending on severe using condition when the derivatives are used in gold plating or copper plating using copper pyrophosphate.

Further, for solving the above problems, resin composition wherein one of derivatives of benzotriazole, wherein H combined to N of benzotriazole was substituted with one of linear amino hydrocarbon derivative groups such similar compounds as above as bis (N,N-2-ethylhexyl) aminomethylene-5-carboxy-1,2,3-benzotriazole, was blended in combination with film forming polymer having carboxyl groups with photosensitive resin composition comprising copolymerizable vinyl compounds and photopolymerization initiator or photo-polymerization initiating system was disclosed in U.S. Pat. No. 4,980,266 (1990). However, the derivatives of benzotriazole, of which H combined to N is substituted with one of linear amino hydrocarbon derivative groups, are expensive, and if the same effect can be obtained by using more inexpensive reagent, economical advantage in view of improvement of the method for manufacturing printed circuit board is remarkable.

SUMMARY OF THE INVENTION (1) Objects of the Invention

Object of the present invention is to provide a method for manufacturing printed circuit board by forming copper wiring with chemical plating by a semi-additive method solving the above problem.

(2) Methods of Solving the Problems

In order to prevent plating solution from contamination by adhesion promoter which has been added to plating resist and dissolved into plating solution of a conventional method for manufacturing printed circuit board comprising the steps of forming a photosensitive resin composition layer at surface of a substrate of copper clad laminate, forming a negative pattern of said photosensitive resin composition layer by exposure and development, and forming wiring pattern by chemical copper plating using said negative pattern of said photosensitive resin composition layer as the plating resist, the present invention provides a method for manufacturing printed circuit board using novel photosensitive resin composition as explained hereinafter.

In accordance with the present invention, the photosensitive resin composition comprises at least a linear high polymer composed of repeating units expressed by the following general formula (1) as a component, which is strongly interactive with the following adhesion promoter, and an organic compound expressed by the following general formula (2) as an adhesion promoter, which includes either of nitrogen atom or nitrogen and sulphur atoms having localized lone paired electrons and strong interaction with carboxyl groups.

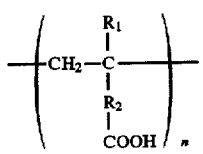

Where, $R_1$ is H, an alkyl group having 1–9 carbon atoms, an alkoxy group having 1–9 carbon atoms, or a carboxyalkyl group having 1–9 carbon atoms, $R_2$ is nil or an alkylene group having 0–9 carbon atoms, and n is the polymerized number of the repeating unit. When the numbers of carbon atoms in $R_1$ and $R_2$ increase, hydrophobic property of the linear high polymer expressed by the formula (1) increases and resolution in forming resist becomes worse on account of using aqueous resist developing solution. Therefore, maximum allowable number of carbon atoms in $R_1$ and $R_2$ for practical use is nine (9), respectively. The number of n is determined in accordance with an average molecular weight required for the linear high polymer. Examples of the linear high polymer expressed by the formula (1) are polymers of acrylic acid, methacrylic acid, α-ethylacrylic acid, and 3-methylcrotonic acid, and the like.

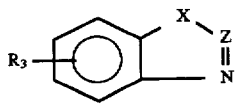

Where, $R_3$ is H, or an alkyl group having 1—6 carbon atoms, X is NH, or S, and Z is either of N, or C—Y, where Y is H, $NH_2$, or SH. Examples of adhesion promoter expressed by the formula (2) are hexaalkylbenzotriazole, benzotriazole, mercaptobenzothiazole, aminobenzothiazole, and the like.

The other components of the photosensitive resin composition, that is, (a) thermoplastic organic high polymer compound, (b) non-water soluble monomer having a photo-polymerizable unsaturated bond, and (c) non-water soluble photo-polymerization initiator which are used in the above conventional method can be used in the present invention.

For instance, as for the thermoplastic organic high polymer compound, polymer or copolymer of alkyl ester methacrylate, alkyl ester α-ethylacrylate, and alkyl ester 3-methylcrotonate, and the like can be used.

As for the non-water soluble monomer having a photo-polymerizable unsaturated bond, compounds obtained by addition reaction of a polyhydric alcohol with an α-unsaturated carboxylic acid such as trimethylolpropane di(meth)acrylate, tetramethylolmethane tri(meth)acrylate, and the like can be used solely or as a mixture.

As for the non-water soluble photo-polymerization initiator, aromatic ketones such as benzophenones, and benzoin ethers such as benzoin methyl ethers can be used solely or as a mixture of more than two kinds of the above compounds.

The above each components other than the linear high polymer composed of repeating units expressed by the general formula (1) can be used in the present invention with the same blending ratio as the conventional method disclosed in the above prior art.

The linear high polymer composed of repeating units expressed by the general formula (1) must be used at least by the amount of 20–500 equivalent to the adhesion promoter based on a relationship that one carboxyl group in the high polymer is equivalent to one molecule of the adhesion promoter.

For instance, total amount of the photosensitive resin composition is taken as 100 parts by weight, the linear high polymer expressed by the general formula (1) 1–10 parts by weight, a non-water soluble photo-polymerization initiator 1–10 parts by weight, and the adhesion promoter expressed by the general formula (2) 0.01–1 part by weight are mixed, and the residual is adjusted to be 100 parts of the photosensitive resin composition by a mixture of thermoplastic organic high polymer 40–50 parts and non-water soluble monomer having a photo-polymerizable unsaturated bond 40–50 parts.

In accordance with the present invention, the linear high polymer expressed by the general formula (1) has a carboxyl group at side chain which interacts strongly with the adhesion promoter expressed by the general formula (2). Accordingly, elution of the adhesion promoter from the plating resist into the plating solution at the chemical copper plating operation can be prevented.

Generally, an adhesion promoter is added into resist in order to increase adhesiveness of the resist to copper clad laminate. If boundary of the resist and the copper clad laminate separates in a copper plating operation, copper plating film is formed at unnecessary portions and a short circuit failure of wiring occurs. However, plating solution is generally a strong electrolytic solution, and the adhesion promoter has a strong polarity on account of containing nitrogen atom and mercapto group (SH group) having lone paired electrons. Therefore, the adhesion promoter is easily dissolved into the plating solution. Further, ions of copper, one of transient metals, are contained in chemical copper plating solution, and nitrogen atom and sulphur atom of mercapto group having lone paired electrons easily form an coordinate bond with the copper ions. Therefore, the adhesion promoter containing such nitrogen atoms and sulphur atoms can be dissolved remarkably into the plating solution. Once the adhesion promoter is dissolved into the plating solution, the adhesion promoter having strong affinity with metal is adsorbed into metal plating film. And, the adsorbed adhesion promoter decreases mechanical strength of the metal plating film. Especially, a problem of decreasing breaking elongation of the wiring film, which is one of the important mechanical properties of the wiring film, is generated by adsorbing the adhesion promoter into the metallic plating film. The problem must be solved because it causes breakage of the wiring and lowers reliability of the printed wiring board. Accordingly, it is important that elution of the adhesion promoter contained in the resist into the plating solution must be prevented as possible.

In view of the above aspect, the present invention uses specific photosensitive resin composition for preparing plating resist, wherein a linear high polymer having carboxyl group at side chain is contained in combination with a relationship of an adhesion promoter containing either of nitrogen atom or nitrogen and sulphur atoms having lone paired electrons which are strongly interactive with carboxyl group, and accordingly, elution of the adhesion promoter from the resist into plating solution at chemical copper plating operation can be prevented.

The reaction mechanism of the operation of the above photosensitive resin composition can be explained as follows;

The nitrogen atom in the adhesion promoter having a lone paired electrons takes in a hydrogen ion in the plating solution and is charged negatively. On the contrary, the carboxyl group in the repeating unit expressed by the general formula (1) of the linear high polymer releases a hydrogen ion and is charged positively. Therefore, the negatively charged adhesion promoter interacts statically with the positively charged carboxyl group in the linear high polymer to be stabilized, and accordingly, the adhesion promoter is retained firmly in the high polymer and is prevented from elusion into the plating solution. In case of the adhesion promoter having sulphur atom, hydrogen atom in the proton of SH group is charged positively and interacts statically with the negatively charged oxygen of carboxyl group in the linear high polymer to be stabilized, and accordingly, the adhesion promoter is retained firmly in the high polymer and is prevented from elusion into the plating solution. In the above interaction, one molecule of the adhesion promoter reacts with one of the carboxyl dipole. Therefore, an equivalent amount of carboxyl group in the high polymer to the adhesion promoter is sufficient theoretically. Actually, as the embodiments of the present invention show later, it is desirable to contain at least 20 times equivalent of carboxyl group per one equivalent adhesion promoter in the resist for completing the reaction. However, an existence of extreme excess of carboxyl group in the resist increases water absorbing capacity of the resist and causes a large amount of swelling of the resist, and as a result, a phenomenon to narrow plated wire occurs. Therefore, the maximum content of the carboxyl group in practical use is desirably limited as 10 parts by weight when total weight of the photosensitive resin composition is taken as 100 parts by weight.

The method for manufacturing printed wiring board claimed in the present application is suitable for obtaining wiring having a high density and a large aspect ratio by chemical copper plating process.

BRIEF DESCRIPTION OF THE DRAWINGS

FIG. 1 is a flow chart indicating a wiring forming process by a semi-additive method shown in the embodiment 1 of the present invention.

DETAILED DESCRIPTION OF THE EMBODIMENTS

Embodiment 1

Figure 2A:
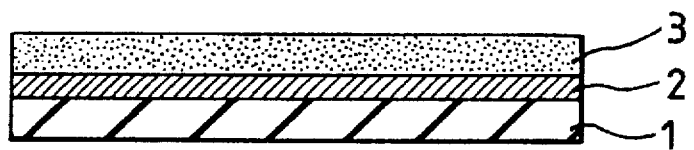
FIG. 2a–f are schematic cross sections of the printed circuit board at each steps of the wiring forming process by a semi-additive method shown in the embodiment 1 of the present invention.
Figure 2B:
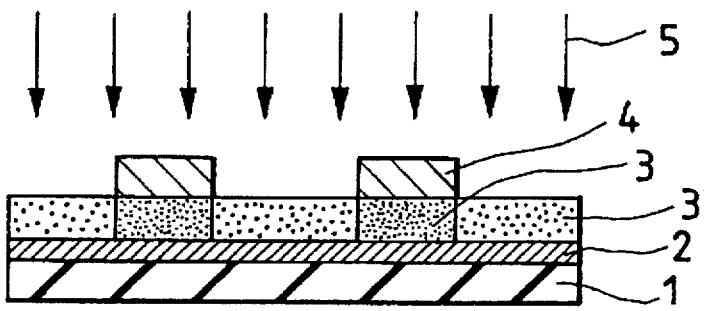
Figure 2C:
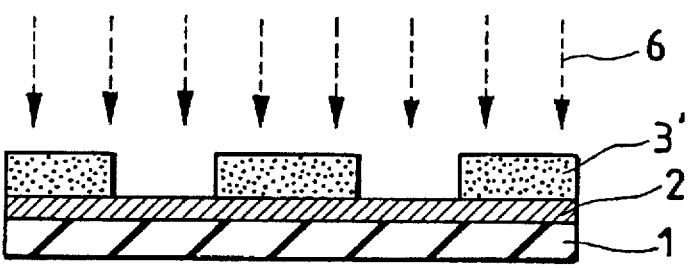
Figure 2D:
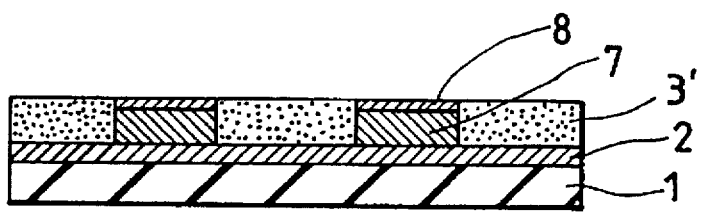
Figure 2E:
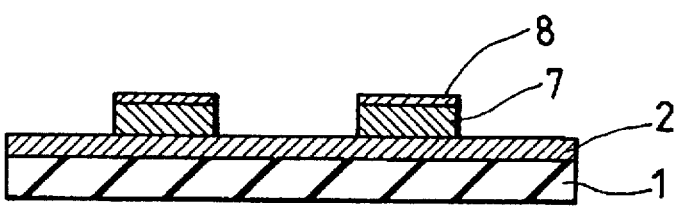
Figure 2F:
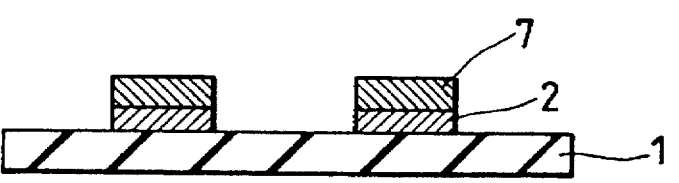

FIG. 1 indicates a flow chart of a printed wiring board manufacturing process by a semi-additive method of the present invention. FIG. 2 indicates schematic cross sections of the printed circuit board at corresponding each steps of the above manufacturing process.

First, resist 3 was laminated onto a substrate comprising a copper foil 2 and an insulator 1 (FIGS. 1 and 2, step a). The resist 3 was made of a photosensitive resin composition 3 composed of, total amount of the photosensitive resin composition was taken as 100 parts by weight, polymethacrylic acid as the linear high polymer expressed by the general formula (1) of various content in a range of 0–10 parts by weight (0–500 equivalent to the adhesion promoter) for parametric study, Irugacure (made by Chiba-Geigie Co.) as a non-water soluble photo-polymerization initiator 5 parts by weight, and hexaalkyl benzotriazole as the adhesion promoter expressed by the general formula (2) 0.05, 0.1 parts by weight, respectively, and zero as a blank, and the residual was adjusted by a 50:50 mixture of co-polymer of methacrylic methyl ester and methacrylic ethyl ester as a thermoplastic organic high polymer and BPE (made by Sinnakamura Chemical Co.) as a non-water soluble monomer having photo-polymerizable unsaturated bond to form 100 parts of the photosensitive resin composition. Thickness of the resist film was 75 μm.

Next, after exposing a pattern using photomask 4 with activating light 5 (FIGS. 1 and 2, b), a negative pattern was formed as exposed photosensitive composition 3' on the copper clad laminate by developing process (FIGS. 1 and 2, c). As for developing solution 6, an aqueous solution of a mixture of diethyleneglycol monobutylether 200 ml/liter and borax 8 g/liter was used. Subsequently, the copper clad laminate whereon the negative pattern formed was processed by chemical copper plating process (FIGS. 1 and 2, d) at 72° C. for 32–35 hours. Plating solution at the plating process was an aqueous solution of a mixture of copper sulfate 10 g/liter, $EDTA2Na.2H_2O$ 30 g/liter, sodium hydroxide necessary amount for adjusting pH 12.6, formalin 3 ml/liter, polyethyleneglycol 10 g/liter, and 2,2'-bipyridine 30 mg/liter. Resist area immersed in the plating solution was 2 $dm^2$ per a liter of the plating solution. At the present step, no swelling and separation of the resist were observed after the plating process.

Next, solder plating 8 was formed by plating process onto the copper plating 7 by 1 $A/dm^2$ for 15 minutes. The solder plating solution was an aqueous solution containing Sn (II) ion 15 g/liter, Pb (II) ion 10 g/liter, boric acid 40 g/liter, and fluoroboric acid 300 g/liter. After eliminating plating resist by immersing the plated copper clad laminate into methylene chloride (FIGS. 1 and 2, e), copper layer in portions other than wiring formed portion was eliminated by etching (FIGS. 1 and 2, f) using alkaline etching solution containing copper ammonium salt. Finally, solder plated portion was eliminated by etching using etching solution containing nitric acid (FIGS. 1 and 2, f).

In the present embodiment, breaking elongation of the plated copper film was determined as an index for contamination of the copper plating solution. When the plating solution is contaminated with the adhesion promoter, the breaking elongation of the plated copper film decreases because of adsorbing the adhesion promoter into the plated copper film. If the breaking elongation decreases, the wire made of the plated copper film becomes brittle and is easily broken. Therefore, the breaking elongation is one of the important mechanical properties of the wiring in view of reliability, and using the breaking elongation as an index for the contamination by the adhesion promoter is meaningful in practical use. A result of the present embodiment is shown in FIG. 3 as a graph indicating a relationship between the amount of polymethacrylic acid in resist and breaking elongation of plated copper film when the copper film was formed by chemical copper plating using hexaalkylbenzotriazole as the adhesion promoter in the resist.

Figure 3:
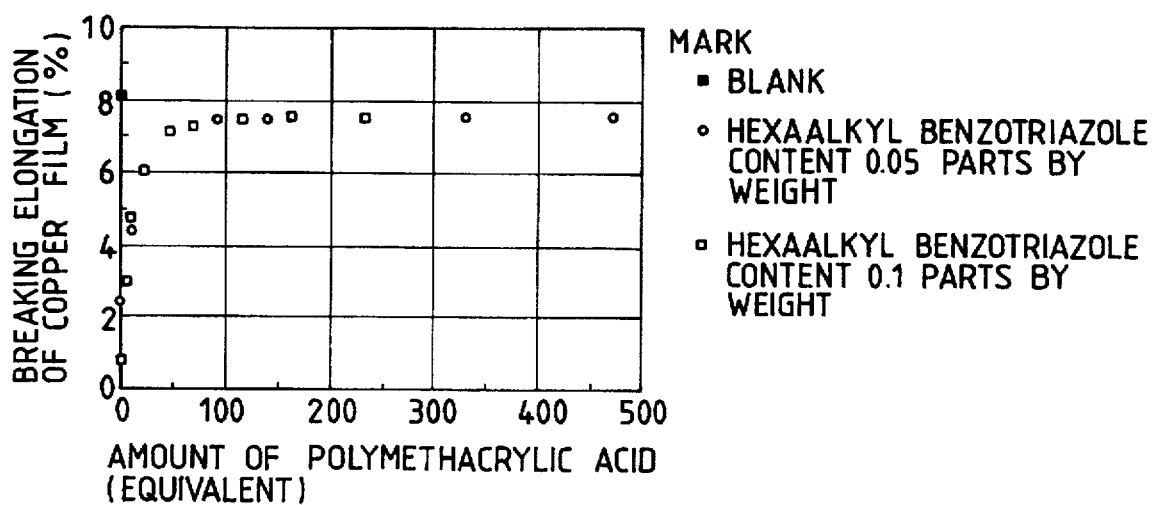
FIG. 3 is a graph indicating a relationship between the amount of methacrylic acid in resist and breaking elongation of plated copper film when the copper film was formed by chemical copper plating using hexaalkylbenzotriazole as the adhesion promoter in the resist.

FIG. 3 shows that if the adding amount of the polymethacrylic acid exceeds approximately 20 times equivalent to the adhesion promoter, hexaalkyl benzotriazole, the breaking elongation of the plated copper film can be recovered more than 70% of blank sample (no adhesion promoter contains) which is deemed as usable in practical use. The result means that elution of the adhesion promoter into the plating solution can be decreased by adding a compound having more than 20 equivalent of carboxyl group to the adhesion promoter into plating resist, and contamination of the plating solution can be restricted by the present invention to a meaningful extent in practical use.

Embodiment 2

A photosensitive resin composition including poly α-ethylacrylic acid as the linear high polymer expressed by the general formula (1) of various content in a range of 0–10 parts by weight (0–240 equivalent to the adhesion promoter) for parametric study, benzotriazole as the adhesion promoter expressed by the general formula (2) 0.05, 0.1 parts by weight, respectively, and zero as a blank, and other components as same as the embodiment 1 was used for making plating resist of 75 μm thick. The plating resist was used in the same processing as the embodiment 1 for preparing plated copper film.

Figure 4:
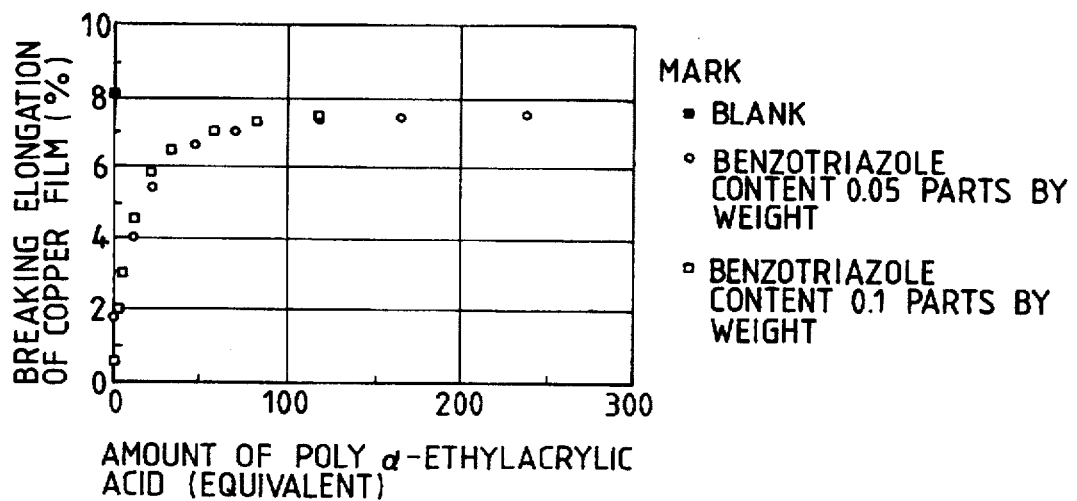
FIG. 4 is a graph indicating a relationship between the amount of α-ethylacrylic acid in resist and breaking elongation of plated copper film when the copper film was formed by chemical copper plating using benzotriazole as the adhesion promoter in the resist.

Then, a relationship between breaking elongation of the prepared plated copper film and the amount of poly α-ethylacrylic acid was determined experimentally. A result of the present embodiment is shown in FIG. 4 as a graph indicating a relationship between the amount of poly α-ethylacrylic acid in resist and breaking elongation of plated copper film when the copper film was formed by chemical copper plating using benzotriazole as the adhesion promoter in the resist. No swelling and separation of the resist were observed after the copper plating process.

FIG. 4 shows that if the adding amount of the poly α-ethylacrylic acid exceeds approximately 25 times equivalent to the adhesion promoter, benzotriazole, the breaking elongation of the plated copper film is recovered more than 70% of blank sample (no adhesion promoter contains) which is deemed as usable in practical use. The result means that elution of the adhesion promoter into the plating solution can be decreased by adding a compound having carboxyl group into plating resist, and contamination of the plating solution can be restricted.

Embodiment 3

A photosensitive resin composition including polyacrylic acid as the linear high polymer expressed by the general formula (1) of various content in a range of 0–10 parts by weight (0–470 equivalent to the adhesion promoter) for parametric study, mercaptobenzothiazole as the adhesion promoter expressed by the general formula (2) 0.05, 0.1 parts by weight, respectively, and zero as a blank, and other components as same as the embodiment 1 was used for making plating resist of 75 μm thick. The plating resist was used in the same processing as the embodiment 1 for preparing plated copper film.

Figure 5:
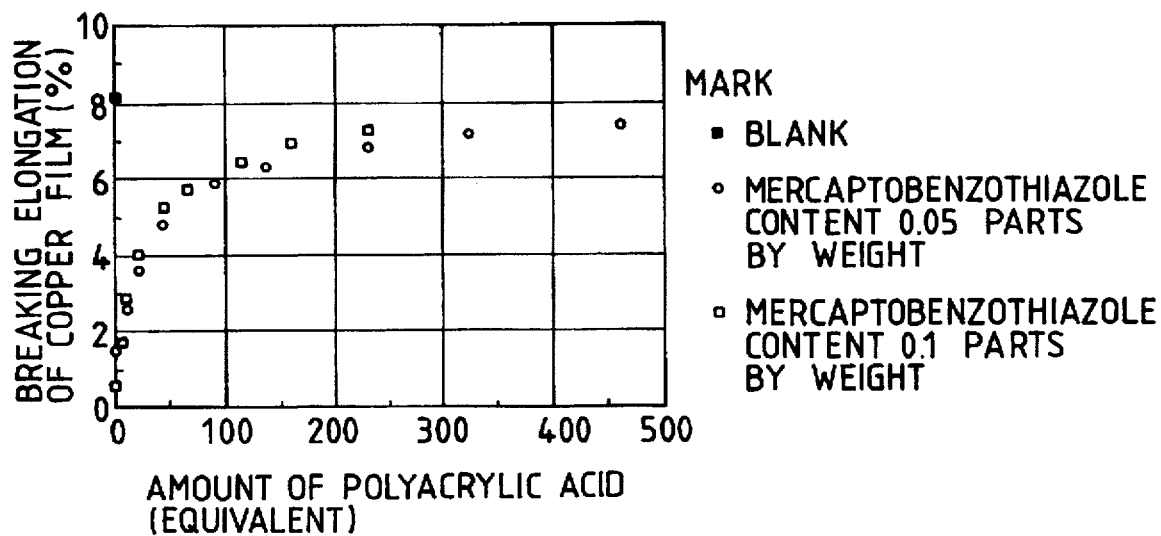
FIG. 5 is a graph indicating a relationship between the amount of acrylic acid in resist and breaking elongation of plated copper film when the copper film was formed by chemical copper plating using mercaptobenzothiazole as the adhesion promoter in the resist.

Then, a relationship between breaking elongation of the prepared plated copper film and the amount of polyacrylic acid was determined experimentally. A result of the present embodiment is shown in FIG. 5 as a graph indicating a relationship between the amount of polyacrylic acid in resist and breaking elongation of plated copper film when the copper film was formed by chemical copper plating using mercaptobenzothiazole as the adhesion promoter in the resist. No swelling and separation of the resist were observed after the copper plating process.

FIG. 5 shows that if the adding amount of the polyacrylic acid exceeds approximately 100 times equivalent to the adhesion promoter, mercaptobenzothiazole, the breaking elongation of the plated copper film is recovered more than 70% of blank sample (no adhesion promoter contains) which is deemed as usable in practical use. The result means that elution of the adhesion promoter into the plating solution can be decreased by adding a compound having carboxyl group into plating resist, and contamination of the plating solution can be restricted.

Embodiment 4

Figure 6:
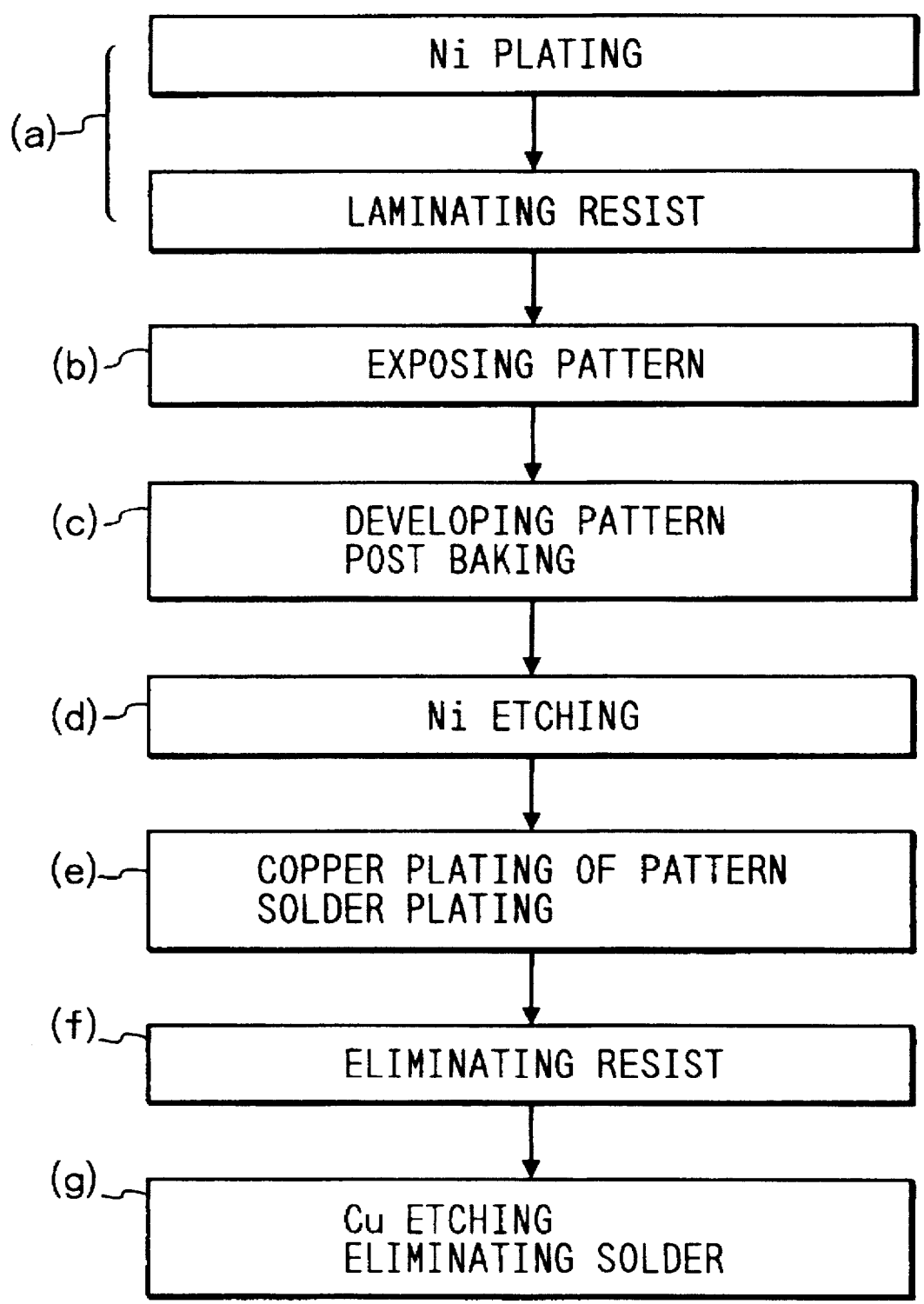
FIG. 6 is a flow chart indicating a wiring forming process by a semi-additive method shown in the embodiment 4 of the present invention.
Figure 7A:
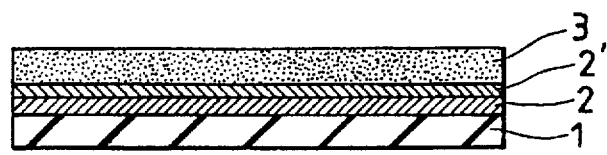
FIG. 7a–g are a schematic cross sectional view of the printed circuit board at each steps of the wiring forming process by a semi-additive method shown in the embodiment 4 of the present invention.
Figure 7B:
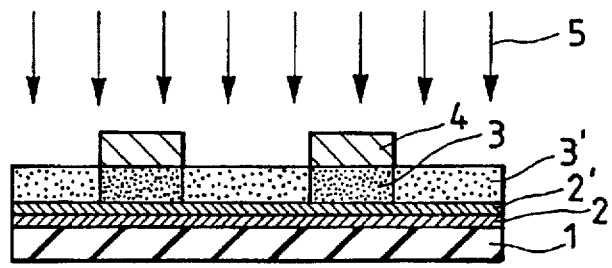
Figure 7C:
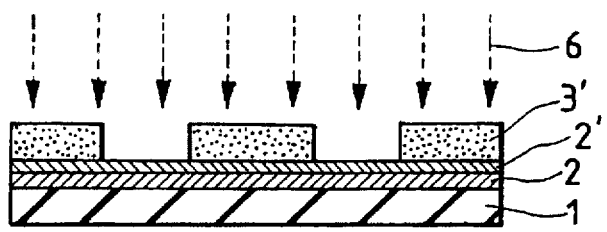
Figure 7D:
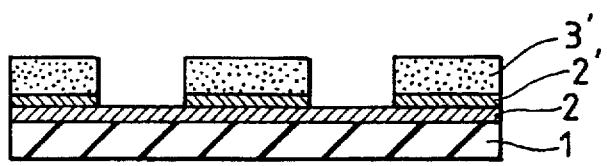
Figure 7E:
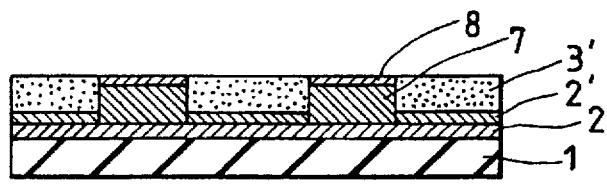
Figure 7F:
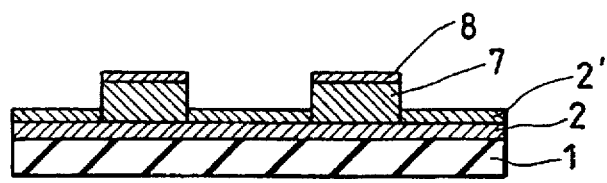
Figure 7G:
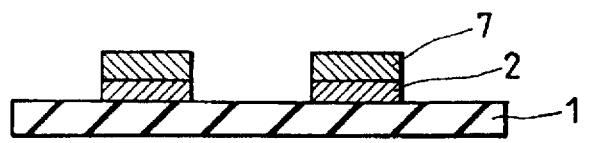

FIG. 6 indicates a flow chart of a printed wiring board manufacturing process by a semi-additive method of the present invention. FIG. 7 indicates schematic cross sections of the printed circuit board at corresponding each steps of the above manufacturing process.

First, nickel plating 2' was formed onto surface of a copper clad laminate comprising an insulator 1 and a copper foil 2 with a condition of 0.1 A/dm$^2$ for 6 minutes (FIGS. 6 and 7, step a). Composition of nickel plating solution was aqueous solution containing nickel sulphate 200 g/liter, boric acid 15 g/liter, and sodium perchlorate 15 g/liter. Then, resist 3 was laminated onto surface of the nickel plating 2' (FIGS. 6 and 7, a). The resist 3 was made of a photosensitive resin composition 3 composed of, total amount of the photosensitive resin composition was taken as 100 parts by weight, poly 3-methylcrotonic acid as the linear high polymer expressed by the general formula (1) of various content in a range of 0–10 parts by weight (0–270 equivalent to the adhesion promoter) for parametric study, Irugacure (made by Chiba-Geigie Co.) as a non-water soluble photo-polymerization initiator 5 parts by weight, and aminobenzothiazole as the adhesion promoter expressed by the general formula (2) 0.05, 0.1 parts by weight, respectively, and zero as a blank, and the residual is adjusted by a 50:50 mixture of co-polymer of methacrylic methyl ester and methacrylic ethyl ester as a thermoplastic organic high polymer and BPE (made by Sinnakamura Chemical Co.) as a non-water soluble monomer having photo-polymerizable unsaturated bond to form 100 parts of the photosensitive resin composition. Thickness of the resist film was 75 μm.

Next, after exposing a pattern using photomask 4 with activating light 5 (FIGS. 6 and 7, b), a negative pattern was formed by exposed photosensitive composition 3' on the nickel plating 2' by developing process (FIGS. 6 and 7, c). As for developing solution 6, an aqueous solution of a mixture of diethyleneglycol monobutylether 200 ml/liter and borax 8 g/liter was used. Subsequently, the copper clad laminate whereon the negative pattern formed was processed for nickel etching (FIGS. 6 and 7, d) for about 90 seconds for eliminating nickel plating. Etching solution at the etching process was an aqueous solution of a mixture of hydrogen peroxide aqueous solution 50 ml/liter, N-950A (made by Mertechs Co.) 500 ml/liter, and N-950B (made by Mertechs Co.) 100 ml/liter. Subsequently, copper plating 7 of pattern was formed onto surface of the copper layer 2 by immersing into the plating solution at 72° C. for 32–35 hours. Plating solution was an aqueous solution of a mixture of copper sulfate 10 g/liter, EDTA2Na.2H$_2$O 30 g/liter, sodium hydroxide necessary amount for adjusting pH 12.6, formalin 3 ml/liter, polyethyleneglycol 10 g/liter, and 2,2'-bipyridine 30 mg/liter. Resist area immersed in the plating solution was 2 dm$^2$ per a liter of the plating solution. At the present step, no swelling and separation of the resist were observed after the plating process.

Next, solder plating 8 was formed by a plating process onto the copper plating 7 by 1 A/dm$^2$ for 15 minutes. The solder plating solution was an aqueous solution containing Sn (II) ion 15 g/liter, Pb (II) ion 10 g/liter, boric acid 40 g/liter, and fluoroboric acid 300 g/liter. No swelling and separation of the resist were observed after the solder plating process.

After eliminating resist 3' by immersing the plated copper clad laminate into methylene chloride (FIGS. 6 and 7, f), surface of the copper clad laminate was treated by nickel etching process for 90 seconds. Etching solution at the etching process was an aqueous solution of a mixture of hydrogen peroxide aqueous solution 50 ml/liter, N-950A (made by Mertechs Co.) 500 ml/liter, and N-950B (made by Mertechs Co.) 100 ml/liter (FIGS. 6 and 7, g). Then, copper layer 2 in portions other than wiring formed portion was eliminated by etching (FIGS. 6 and 7, g) using alkaline etching solution containing copper ammonium salt. Finally, solder plated portion was eliminated by etching using etching solution containing nitric acid (FIGS. 6 and 7, g).

In the present embodiment, breaking elongation of the plated copper film was used as an index for contamination of the copper plating solution as well as the embodiment 1. A relationship between the amount of poly 3-methylcrotonic acid in resist and breaking elongation of plated copper film when the copper film was formed by chemical copper plating using aminobenzothiazole as the adhesion promoter in the resist.

Figure 8:
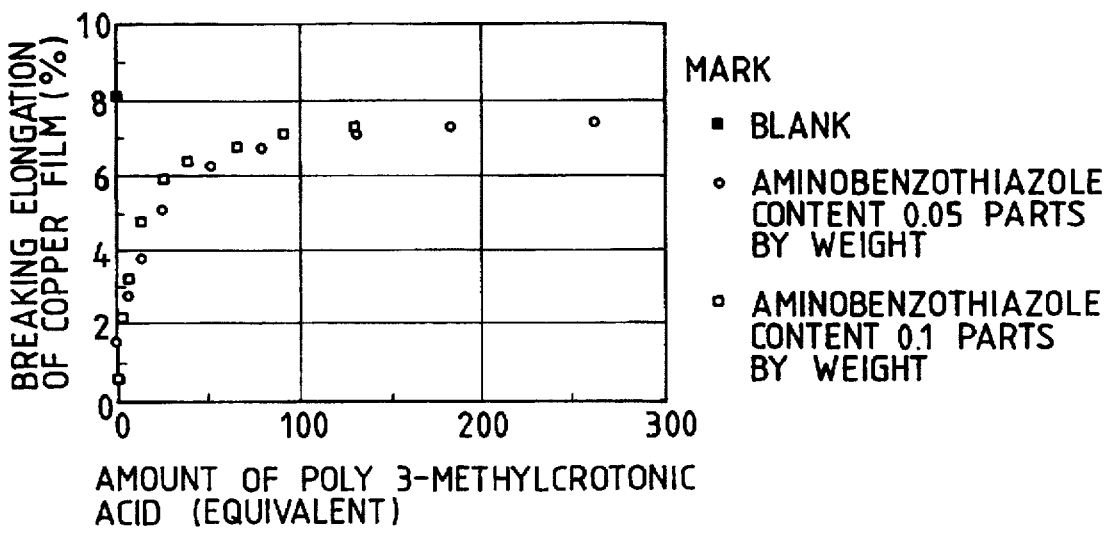
FIG. 8 is a graph indicating a relationship between the amount of 3-methylcrotonic acid in resist and breaking elongation of plated copper film when the copper film was formed by chemical copper plating using aminobenzothiazole as the adhesion promoter in the resist.

FIG. 8 shows that if the adding amount of the poly 3-methylcrotonic acid exceeds approximately 30 times equivalent to the adhesion promoter, aminobenzothiazole, the breaking elongation of the plated copper film can be recovered more than 70% of blank sample (no adhesion promoter contains) which is deemed as usable in practical use. The result means that elution of the adhesion promoter into the plating solution can be decreased by adding a compound having carboxyl group into plating resist, and contamination of the plating solution can be restricted by the present invention to a meaningful extent in practical use.

In accordance with the present invention, contamination of the plating solution by adhesion promoter can be reduced remarkably, and consequently, reliability of wiring increases significantly.

What is claimed is:

1. A method of manufacturing printed circuit board comprising the steps of:
   forming a photosensitive resin composition layer at surface of a metal clad laminate comprising a metal clad and an insulating substrate,
   forming a negative pattern of said photosensitive resin composition layer by exposure and development, and
   forming wiring pattern by electroless plating using said negative pattern of said photosensitive composition layer as the plating resist, wherein
   said photosensitive resin comprises at least
      a linear high polymer composed of repeating units expressed by the following general formula (1):

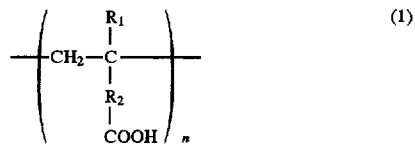

where, R$_1$ is H, an alkyl group having 1–9 carbon atoms, an alkoxy group having 1–9 carbon atoms, or a carboxyalkyl group having 1–9 carbon atoms, R$_2$ is nil or an alkylene group having 1–9 carbon atoms and n is the polymerized number of the repeating unit, and an organic compound expressed by the following general formula (2):

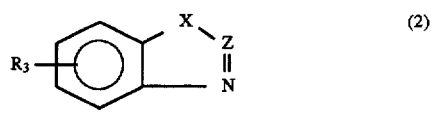

where R$_3$ is H or an alkyl group having 1–6 carbon atoms, X is NH or S, and Z is N or C—Y, where Y is H, NH$_2$, or SH;

said photosensitive resin composition containing at least 20–500 carboxyl groups of said linear high polymer composed of repeating units expressed by the general formula (1) per one molecule of said organic compound expressed by the general formula (2).

2. A method for manufacturing printed circuit board as claimed in claim 1, wherein
   said metal clad is composed of a material selected from the group consisting of Au, Ag, Cu, Ni, Cr, Ti, Sn, Pb and their alloys.

3. A method for manufacturing printed circuit board as claimed in any one of claims 1 and 2,
   which further comprises forming a metallic layer composed of a material selected from the group consisting of Au, Ag, Ni, Cr, Sn, Ti, and Zn on the surface of said metal clad laminate, and wherein said photosensitive resin composition layer is formed on the surface of said metallic layer before said negative pattern of said photosensitive resin layer is formed by exposure and development.

4. A method for manufacturing printed circuit board comprising the steps of:
   forming a photosensitive resin composition layer at surface of a metal clad laminate comprising a metal clad and an insulating substrate,
   forming a negative pattern of said photosensitive resin composition layer by exposure and development, and
   forming wiring pattern by electroless plating using said negative pattern of said photosensitive composition layer as the plating resist, wherein
   said photosensitive resin comprises at least
      a linear high polymer composed of repeating units expressed by the following general formula (1):

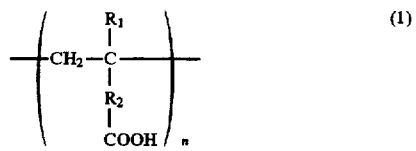

where, R$_1$ H, an alkyl group having 1–9 carbon atoms, an alkoxy group having 1–9 carbon atoms, or a carboxyalkyl group having 1–9 carbon atoms, $R_2$ is nil or an alkylene group having 1–9 carbon atoms and n is the polymerized number of the repeating unit, and an organic compound expressed by the following general formula (2):

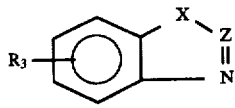
(2)

where $R_3$ is H or an alkyl group having 1–6 carbon atoms, X is NH or S, and Z is N or C—Y, where Y is H, $NH_2$, or SH; and wherein said photosensitive resin composition contains at least 1–10 parts by weight of said linear high polymer composed of repeating units expressed by the general formula (1), and 0.01–1 parts by weight of said organic compound expressed by the general formula (2), when taking total weight of said photosensitive resin composition as 100 parts by weight.

5. A method for manufacturing printed circuit board comprising the steps of:

forming a photosensitive resin composition layer at surface of a metal clad laminate comprising a metal clad and an insulating substrate, forming a negative pattern of said photosensitive resin composition layer by exposure and development, forming wiring pattern by electroless plating using said negative pattern of said photosensitive composition layer as the plating resist, wherein said photosensitive resin comprises at least a linear high polymer composed of repeating units expressed by the following general formula (1):

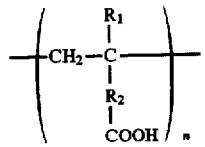
(1)

where, $R_1$ is H, an alkyl group having 1–9 carbon atoms, an alkoxy group having 1–9 carbon atoms, or a carboxyalkyl group having 1–9 carbon atoms, $R_2$ is nil or an alkylene group having 1–9 carbon atoms and n is the polymerized number of the repeating unit, and an organic compound expressed by the following general formula (2):

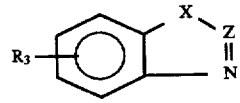
(2)

where $R_3$ is H or an alkyl group having 1–6 carbon atoms, X is NH or S, and Z is N or C—Y, where Y is H, $NH_2$, or SH; and further comprising forming a metallic layer composed of a material selected from the group consisting of Au, Ag, Ni, Cr, Sn, Ti and Zn on the surface of said metal clad laminate, wherein said photosensitive resin composition is formed on the surface of said metallic layer before said negative pattern of said photosensitive layer is formed by exposure and development and wherein said photosensitive resin composition contains at least 1–10 parts by weight of said linear high polymer composed of repeating units expressed by the general formula (1), and 0.01–1 parts by weight of said organic compound expressed by the general formula (2), when taking total amount of said photosensitive resin composition as 100 parts by weight.

6. A method for manufacturing printed circuit board comprising the steps of:

forming a photosensitive resin composition layer at surface of a metal clad laminate comprising a metal clad and an insulating substrate, wherein said metal clad is composed of a material selected from the group consisting of Au, Ag, Cu, Ni, Cr, Ti, Sn, Pb and their alloys, forming a negative pattern of said photosensitive resin composition layer by exposure and development, and forming wiring pattern by electroless plating using said negative pattern of said photosensitive composition layer as the plating resist, wherein said photosensitive resin comprises at least a linear high polymer composed of repeating units expressed by the following general formula (1):

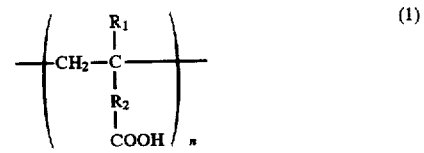
(1)

where, $R_1$ is H, an alkyl group having 1–9 carbon atoms, an alkoxy group having 1–9 carbon atoms, or a carboxyalkyl group having 1–9 carbon atoms, $R_2$ is nil or an alkylene group having 1–9 carbon atoms and n is the polymerized number of the repeating unit, and an organic compound expressed by the following general formula (2):

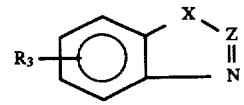
(2)

where $R_3$ is H or an alkyl group having 1–6 carbon atoms, X is NH or S, and Z is N or C—Y, where Y is H, $NH_2$, or SH; and wherein said photosensitive resin composition contains at least 1–10 parts by weight of said linear high polymer composed of repeating units expressed by the general formula (1), and 0.01–1 parts by weight of said organic compound expressed by the general formula (2), when taking total weight of said photosensitive resin compoisition as 100 parts by weight.

7. A method for manufacturing printed circuit board comprising the steps of:

forming a photosensitive resin composition layer at surface of a metal clad laminate comprising a metal clad and an insulating substrate, wherein said metal clad is composed of a material selected from the group consisting of Au, Ag, Cu, Ni, Cr, Ti, Sn, Pb and their alloys, forming a negative pattern of said photosensitive resin composition layer by exposure and development, forming wiring pattern by electroless plating using said negative pattern of said photosensitive composition layer as the plating resist, wherein said photosensitive resin comprises at least;

a linear high polymer composed of repeating units expressed by the following general formula (1):

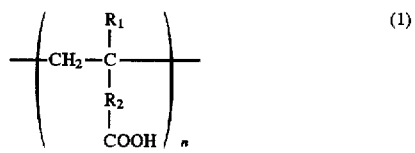

where, $R_1$ is H, an alkyl group having 1–9 carbon atoms, an alkoxy group having 1–9 carbon atoms, or a carboxyalkyl group having 1–9 carbon atoms, $R_2$ is nil or an alkylene group having 1–9 carbon atoms and n is the polymerized number of the repeating unit, and an organic compound expressed by the following general formula (2):

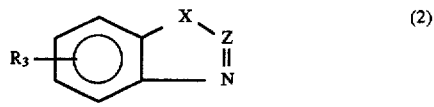

where $R_3$ is H or an alkyl group having 1–6 carbon atoms, X is NH or S, and Z is N or C—Y, where Y is H, $NH_2$, or SH; and further comprising forming a metallic layer composed of a material selected from the group consisting of Au, Ag, Ni, Cr, Sn, Ti and Zn on the surface of said metal clad laminate, wherein said photosensitive resin composition is formed on the surface of said metallic layer before said negative pattern of said photosensitive layer is formed by exposure and development and wherein said photosensitive resin composition contains at least 1–10 parts by weight of said linear high polymer composed of repeating units expressed by the general formula (1), and 0.01–1 parts by weight of said organic compound expressed by the general formula (2), when taking total amount of said photosensitive resin composition as 100 parts by weight.

* * * * *